(12) United States Patent
Westwood

(10) Patent No.: US 6,902,826 B1
(45) Date of Patent: Jun. 7, 2005

(54) HIGH MOMENT FILMS WITH SUB-MONOLAYER NANOLAMINATIONS RETAINING MAGNETIC ANISOTROPY AFTER HARD AXIS ANNEALING

(75) Inventor: John David Westwood, Allentown, PA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/642,620

(22) Filed: Aug. 18, 2000

(51) Int. Cl.$^7$ .............................. B32B 5/00; B32B 15/00
(52) U.S. Cl. .................. 428/601; 428/632; 428/668; 428/195; 428/336; 428/692; 427/130; 427/131
(58) Field of Search .................. 428/601, 632, 428/668, 195, 336, 692, 611, 623, 627, 678, 680, 681, 338, 900; 427/130, 131

(56) References Cited

U.S. PATENT DOCUMENTS

| | | | |
|---|---|---|---|
| 3,520,664 A | * 7/1970 | York ........................ 428/621 |
| 4,430,183 A | 2/1984 | Schuller et al. |
| 4,448,854 A | 5/1984 | Schuller et al. |
| 4,608,297 A | * 8/1986 | Shimada et al. ............ 428/215 |
| 4,952,295 A | 8/1990 | Kawabata et al. |
| 5,315,282 A | * 5/1994 | Shinjo et al. ............. 338/32 R |
| 5,447,781 A | 9/1995 | Kano et al. |
| 5,580,664 A | * 12/1996 | Tsai ......................... 428/457 |
| 5,600,520 A | 2/1997 | Aokura et al. |
| 5,736,264 A | * 4/1998 | Ishiwata et al. ........ 428/694 R |
| 5,792,547 A | 8/1998 | Liu et al. |
| 5,864,452 A | * 1/1999 | Hirano et al. ............... 360/122 |
| 5,919,580 A | * 7/1999 | Barnard et al. ............. 428/692 |
| 5,939,186 A | 8/1999 | Tokutake et al. |
| 5,998,016 A | * 12/1999 | Sasaki et al. ............... 428/336 |
| 6,278,590 B1 | * 8/2001 | Gill et al. .................... 360/317 |
| 6,456,466 B1 | * 9/2002 | Nakamoto et al. .......... 360/319 |

FOREIGN PATENT DOCUMENTS

| | | |
|---|---|---|
| EP | 0 502 535 A1 | 9/1992 |
| JP | 63-299219 | 12/1988 |
| JP | 1-99203 | 4/1989 |
| JP | 4-240704 | 8/1992 |
| JP | 7-243038 | 9/1995 |
| JP | 7-252650 | 10/1995 |
| JP | 9-293207 | 11/1997 |

OTHER PUBLICATIONS

English Translation of JP 63–299219 A (PTO 03–2551).*
Sin, K. and Wang, S., IEEE Trans. Mag., 32(5), 1996, 3509–3511.*

* cited by examiner

Primary Examiner—Kevin M. Bernatz
(74) Attorney, Agent, or Firm—Oppenheimer Wolfe & Donnelly LLP; William D. Gill

(57) ABSTRACT

A film structure and deposition method for creating laminated Fe—M—N and Fe—M—O—N films which retain good anisotropy after HA annealing are provided. Interleaved layers of thin alumina laminations between the Fe—M—[O]—N layers and sublayer alumina nanolaminations within the Fe—M—[O]—N layers create stable magnetic anisotropy in the film. The magnetic anisotropy in the film survives HA annealing at hardbake resist curing conditions in wafer manufacturing processes for GMR magnetic recording heads.

6 Claims, 3 Drawing Sheets

HIGH MOMENT FILMS WITH SUB-MONOLAYER NANOLAMINATIONS RETAINING MAGNETIC ANISOTROPY AFTER HARD AXIS ANNEALING

BACKGROUND OF THE INVENTION

1. Field of the Invention

This invention relates in general to the field of data storage devices such as disk drives having thin film magnetic disks. More particularly the invention relates to high moment films, their inherent problems with magnetic anisotropy loss during HA anneal processes, and their use in Giant Magnetoresistive (GMR) heads.

2. Description of Related Art

As magnetic recording density increases, materials with higher saturation magnetization, $4\pi M_S$, are required in the write head to write higher coercivity media. At the same time, the data rate is increasing, making domain control more critical in the write head. Such domain control is difficult, however, in state of the art GMR heads because the fabrication process for GMR sensors requires annealing with a magnetic field applied perpendicular to the easy axis (EA) of the pole materials in the write head. Hard axis annealing, required in GMR wafer processing, degrades magnetic anisotropy in Fe-based high moment films. The resulting domain structures are unfavorable for efficient writing in a yoke/pole application and sensor stability in a shield application.

Plated films, such as $Ni_{80}Fe_{20}$, $Ni_{45}Fe_{55}$, and high moment CoNiFe alloys, lose all or nearly all of their anisotropy in these hard axis (HA) annealing steps. As a result, the domains in the poles do not form in the desired orientation parallel to the air bearing surface (ABS). Laminated Fe—M—N (M=1–5 at. % Al, Zr, Ta) films are known in the art and can be made with high $4\pi M_S$=19–20 kG. As with plated films, however, these films are known to lose anisotropy during HA annealing and in many cases to switch their easy axis direction.

The problem of magnetic anisotropy loss in Fe—N based high moment films has been identified in the literature, e.g., in Fe—Ta—N films studied at the University of Alabama. The published literature states that such behavior is intrinsic to this class of materials. Previous RF magnetron processes involving $N_2$ and $N_2O$, produce films that resist hard axis annealing. Also, RF processes tend to be difficult to transfer to multiple tools. On the other hand, work with simple DC magnetron deposition has produced films that have poorly defined anisotropy. DC magnetron films are also extremely sensitive to process conditions and have properties that are harder to control than those of RF films.

SUMMARY OF THE INVENTION

It is a purpose of the invention to improve the current limitations on high moment films and allow progress in technology to include increases in magnetic recording density and data writing rates. More specifically, the present invention seeks to minimize the inherent problems of magnetization saturation and write head domain control in a way that has not been thought of previously.

A magnetic film according to the present invention comprises at least one, and preferably multiple, magnetic layers of an alloy having a general composition, T-M-X, in which T, M, and X are component elements. The first element, T, is one or more of Fe, Co, or Ni. The second element, M, is one or more of B, Al, Si, P, Ti, V, Cr, Cu, Ga, Ge, Zr, Nb, Mo, Ru, In, Sn, Hf, or Ta. The third element, X, is one or more of N, O, or C. Within each magnetic layer, there is at least one and preferably multiple sublayer nanolaminations of a material that is preferably amorphous.

In the present invention, nanolaminations are considered to be laminated layers, on the order of a monolayer or less, with a nominal thickness less than or equal to 3 A. The nanolaminations are discontinuous in their thickness and are therefore measured as an average thickness. The nominal thickness is calculated from the deposition rate measured in a separate calibration run at the specified process conditions, as is well known in the art.

Nanolaminations of the present invention are distinguished from conventional laminating layers in the prior art by their degree of thinness. In the prior art, insulating non-magnetic laminating layers are used to reduce eddy currents at high frequency in magnetic films as described, for example, by Saito et al. in U.S. Pat. No. 4,894,742, incorporated herein by reference. The insulating laminating layers taught in Saito must be thick enough to electrically insulate each magnetic layer. In contrast, the nanolaminating layers of the present invention are considerably thinner and do not electrically insulate magnetic layers from one another. Non-magnetic laminating layers have also been employed to improve magnetic properties by breaking or weakening the magnetic exchange coupling between magnetic layers in the prior art. These layers are taught by Russak, et al., "*Magnetic and Structural Characterization of Sputtered FeN Multilayer Films,* "*J. Appl. Phys.* 70 6427 (1991), M. H. Kryder et al., "*FeAlN/SiO2 and FeAlN/AL2O3 Multilayers for Thin Film Recording Heads,* "*J. Appl. Phys.* 73 6212 (1993), K. Sin et al., "*FeN/AlN Multilayer Films for High Moment Thin Film Recording. Heads,* "*IEEE Trans. Magnetics* 32 3509 (1996), and Nakatani et al., U.S. 49356311 (1990), incorporated herein by reference. However, unlike the laminating layers of the prior art, the nanolaminating layers of the present invention are discontinuous and do not significantly decrease the exchange coupling within the magnetic layer that contains them.

The nanolaminating material can be chosen from a wide variety of oxide, nitride, boride, carbide, or metal materials. Examples are $Al_2O_3$, $SiO_2$, $ZrO_2$, yttria-stabilized $ZrO_2$, $TiO_2$, $HfO_2$, $Ta_2O_5$, $Si_3N_4$, AlN, $B_4C$, SiC, $Si_4N_4$, Ta, Zr, and Hf. The description continues in an illustrative sense with respect to alumina as the nanolaminating material.

To form the laminated film structure, at least one magnetic layer comprising the alloy T—M—X and alumina nanolaminations is laminated adjacent to at least one layer of alumina. The adjacent alumina layer is thinner than the magnetic layer and thicker than the alumina nanolaminations contained in the magnetic layer. A multi-layer film structure according to the invention will have several magnetic layers alternately laminated with relatively thinner alumina layers, wherein the magnetic layers contain nanolaminations of alumina. As in the case of the nanolaminating materials, these alternate alumina layers are chosen from a wide variety of oxide, nitride, boride, carbide, or metal materials. According to the method of the present invention a film structure is laminated onto a substrate. The substrate may be placed on a pallet which rotates under a Fe—Al target and an $Al_2O_3$ target in an apparatus that may employ either DC magnetron sputtering, RF magnetron sputtering, or both. In the environment of an appropriate reactive gas, such as $N_2$ or $N_2O$, the targets will deposit alternating Fe—Al—N or Fe—Al—O—N and $Al_2O_3$ layers on the film surface as the substrate moves under the targets. Such a deposition method will produce a film structure that has the capability to retain excellent magnetic isotropy after it is subjected to an HA annealing process.

An advantage of the present solution is that it allows for the use of DC magnetron for sputtering the magnetic layers, which has a deposition rate nearly 50% higher than that of RF magnetron. Additional significant advantages of DC magnetron deposition include lower substrate temperature and easier process transfer for manufacturing. The magnetic properties of the film structure produced with DC magnetron are close to those achieved with RF magnetron. The shape of the hard axis loop is more permalloy-like than RF magnetron and the process window is larger. The films have more stable domain structures for shield, bilayer P1, yoke, and pole applications in GMR heads due to higher $H_k$ and lower $H_{ch}$ after hard axis annealing. Further, nanolamination alters the microstructure of DC magnetron films, producing better soft magnetic properties. These traits are highly desirable in the field of GMR heads, and are therefore objects of the present invention.

The foregoing and other objects, features, and advantages of the present invention will be apparent from the following detailed description of the preferred embodiments which makes reference to several drawing figures.

BRIEF DESCRIPTION OF THE DRAWINGS

FIG. 4b is a plan view showing the geometric relationship between the pallet, the substrates, and the target in the sputtering device shown in FIG. 4a.

DETAILED DESCRIPTION OF THE PREFERRED EMBODIMENT

In the following description of the preferred embodiments reference is made to the accompanying drawings which form the part thereof, and in which are shown by way of illustration specific embodiments in which the invention may be practiced. It is to be understood that other embodiments may be utilized and structural and functional changes may be made without departing from the scope of the present invention.

Figure 1:
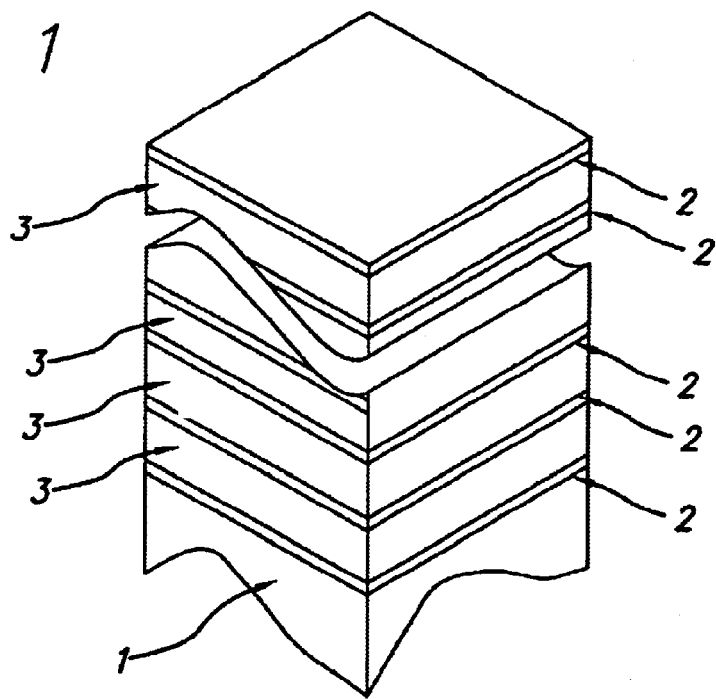
FIG. 1 is a cross-sectional view showing an example of a laminated multi-layer magnetic film according to an embodiment of the present invention.
Figure 2:
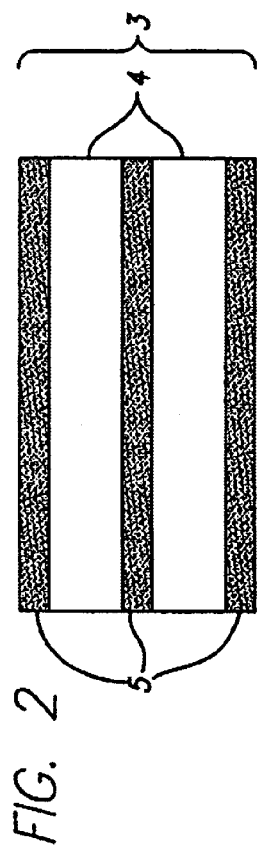
FIG. 2 is a cross-sectional view showing a detailed example of a single magnetic layer of the laminated magnetic film.

A laminated film structure as shown in FIG. 1 is deposited on a ceramic substrate 1. The film structure comprises a first layer of alumina 2 that is approximately 25 A. The second layer 3, shown in detail in FIG. 2, comprises a T-M-X alloy 4 with intermittent sublayer nanolaminations of alumina 5. The T-M-X sublayers 4 are approximately 26 A and the alumina sublayer nanolaminations 5 are approximately 0.2 to 2 A. The sublayers are alternated so that the resultant magnetic layer 3 has a total thickness of approximately 1000 A.

Figure 3A:
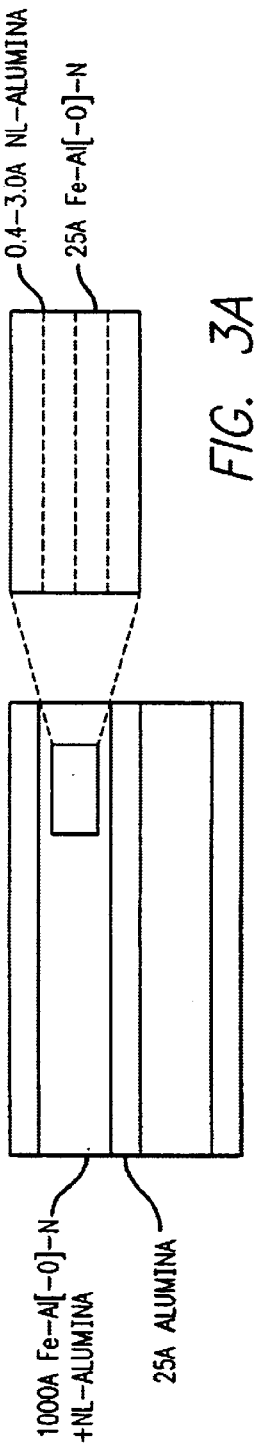
FIG. 3a is a cross-sectional view of a film structure according to one embodiment of the present invention.
Figure 4A:
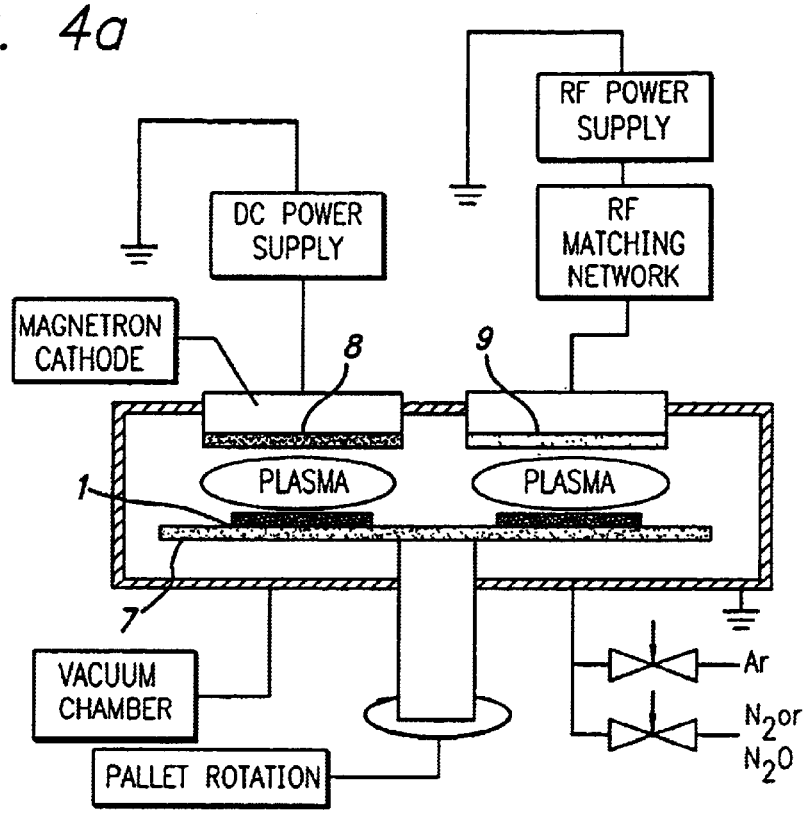
FIG. 4a is an elevation view of a sputtering device that may be used to prepare the multilayer film.
Figure 4B:
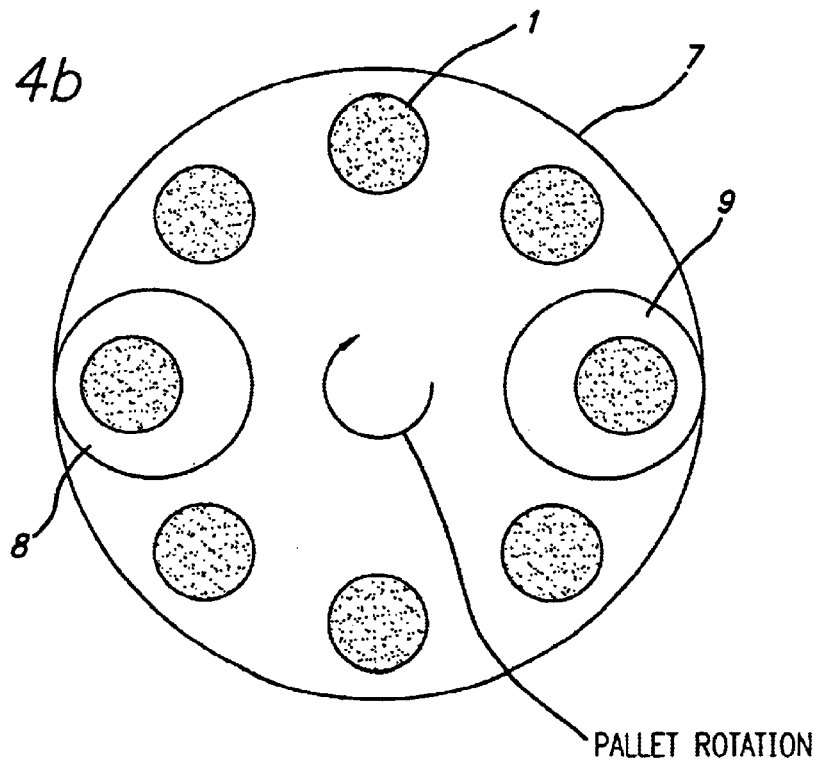

Laminated Fe—Al—N and Fe—Al—O—N films with the structure:

[(25A alumina/1000A (Fe—Al—[O]—N+NL-alumina*)]$_{2x}$/25A alumina=2075A,

*NL=nanolaminated
as shown in FIG. 3a, are deposited on a substrate 1 by reactive magnetron sputtering in an apparatus as shown in FIGS. 4a and 4b, from 200 mm dia. Fe-2at. % Al and alumina targets 8 and 9. For N doped films, $N_2$/Ar gas mixes are used as the process gas; mixes of $N_2O$/Ar are employed to produce films doped with both O and N. The substrates are alumina-TiC composite ceramic coated with approximately $4\mu m$ sputtered amorphous alumina and lapped smooth.

In a sputtering apparatus as shown in FIGS. 4a and 4b, a substrate 1 is located on a pallet 7 that rotates under a Fe—Al target 8 and an alumina target 9. In one embodiment, 25 A alumina layers 2 are deposited by RF magnetron at 1600 W, $4 \times 10^{-3}$ mbar Ar pressure, and -25 V RF substrate bias. The Fe—Al—[O]—N+NL-alumina layers 3 are deposited by simultaneous reactive DC magnetron sputtering from the Fe—Al target 8 and RF magnetron sputtering from the alumina target 9.

During each rotation of the pallet 7, the substrate 1 first receives approximately 26 A of Fe—Al—[O]—N 4. The deposit of this sublayer is followed by a nanolamination of approximately 0.2-2 A alumina 5. The specific thicknesses of the Fe—Al—[O]—N sublayers 4 and the alumina nanolaminations are controlled by the DC and RF powers applied to the Fe—Al target 8 and the alumina target 9, respectively, as well as the pallet rotation speed. The number of rotations of the pallet is specified accordingly to achieve a layer 3 with a total thickness of 1000 A for each main lamination cycle.

In such an embodiment, films with a variety of magnetostriction, anisotropy field $H_k$, hard axis coercivity $H_{ch}$, and easy axis coercivity $H_{cc}$ are obtained, depending on the pallet rotation speed, DC and RF powers, process pressure, substrate bias, and reactive gas concentration. For films deposited at a pallet speed of 10 rpm, 1750W power for Fe—Al (approximately 26 A per rotation), 150 W power for $Al_2O_3$ (approximately 0.6 A per rotation), $1.5 \times 10^{-3}$ mbar total pressure, and with no substrate bias, the following table illustrates the improvement in magnetic properties achieved by nanolamination. These results correspond to the completed process, after annealing the films once on the hard axis HA at typical photoresist hardbake conditions: 232° C., 400 minutes. The properties also remain stable after additional HA annealing.

| Run | Reactive Gas | Alumina Nanolamination | $H_k$ (Oe) | $H_{ch}$ (Oe) | $H_{ce}$ (Oe) | $\lambda$ (× $10^{-6}$) | EA orientation* |
|---|---|---|---|---|---|---|---|
| 293 | 6% $N_2$/Ar | Yes | 11.8 | 0.19 | 0.81 | +0.31 | 0° |
| 300 | 6% $N_2$/Ar | No | 5.2 | 0.81 | 1.36 | -3.98 | 28° |
| 274 | 4% $N_2O$/Ar | Yes | 13.3 | 0.82 | 0.97 | -3.11 | 3° |
| 278 | 4% $N_2O$/Ar | No | 4.2 | 1.40 | 1.51 | -6.66 | 0° |

*0° EA orientation means the easy axis remains in the desired direction after HA annealing.

For processes using either $N_2$ or $N_2O$ as the reactive gas, the effect of alumina nanolamination is to greatly improve the magnetic anisotropy of the films after HA annealing. This is illustrated by substantially increased $H_k$ and smaller $H_{ch}$. It is also illustrated in the case of the $N_2$ doped example by negligible rotation of the easy axis EA during the anneal.

By adjusting the deposition conditions, the magnetic anisotropy of the nanolaminated films is further improved while retaining low magnetorestriction, as shown in the following table.

The process conditions are the same as described previously, except as noted.

| Run | Reactive Gas | Alumina Nanolamination | $H_k$ (Oe) | $H_{ch}$ (Oe) | $H_{ce}$ (Oe) | $\lambda$ (× $10^{-6}$) | EA orientation |
|---|---|---|---|---|---|---|---|
| 294 | 7% $N_2$/Ar | Yes | 10.8 | 0.06 | 0.80 | +2.35 | 0° |
| 272 | 6% $N_2O$/Ar | Yes (300 W) | 10.0 | 0.17 | 1.14 | +1.56 | 7° |

Although the properties of both films are good, the $N_2$ doped film has lower $H_{ch}$ and better easy axis (EA) orientation. Films can be made with the most permalloy-like HA loops after HA annealing of any DC magnetron Fe—N based films made to date. The effect of the alumina nanolamination thickness has been examined by varying the power applied to the alumina target. The results show that power in the range of 100–400W, corresponding to approximately 0.4–1.7 Å alumina, produces the most improvement in magnetic anisotropy and the lowest coercivities after HA annealing. This range of power also yields minimal loss of saturation moment (est. <5%). For higher powers, the EA rotation during annealing becomes unacceptable (>10°). Higher powers also yield an increase in the moment loss due to non-magnetic material. Nanolaminations having thickness greater than 1.7 Å result in undesirable, considerable increases in coercivity. Preferred coercivity levels are approximately 0.2 Oe, corresponding to 0.6 to 0.8 Å nanolaminations.

In addition to depositing sub-monolayer to monolayer amounts of Al and O on the film surface during successive pallet rotations, the RF magnetron process at the alumina target creates reactive nitrogen and/or oxygen species which interact with the film surface. The stray field from the magnetron array at the alumina target may play a role in producing additional magnetic anisotropy in the film by inducing ordering anisotropy between Fe and impurity atoms on the surface of the film. The introduction of controlled amounts of impurity also improves the microstructure by forcing the Fe—Al grains to renucleate and/or reducing the grain size.

Because of these fundamental effects, the benefit of nanolamination on hard axis annealing behavior is expected to apply to the whole class of T-M-X etc. high moment material. In this class, T is one or more of Fe, Co, and Ni. M is one or more of B, Al, Si, P, Ti, V, Cr, Cu, Ga, Ge, Zr, Nb, Mo, Ru, In, Sn, Hf, and Ta. X is one or more of N, O, and C. Likewise the nanolaminating material can be chosen from a wide variety of oxide, nitride, boride, carbide, or metal materials. Examples are $Al_2O_3$, $SiO_2$, $ZrO_2$, yttria-stabilized $ZrO_2$, $TiO_2$, $HfO_2$, $Ta_2O_5$, $Si_3N_4$, AlN, $B_4C$, SiC, $Si_4N_4$, Ta, Zr, and Hf.

In general, materials which sputter slowly relative to the magnetic metal are easier to implement in a practical cosputtering process, for which the ratio of deposition rates between the magnetic material and the nanolaminating material are on the order of 50:1. The choice of reactive gas can include $N_2$, $N_2O_2$, CO, $CO_2$, $CH_4$, NH3, or other N, O, and/or C containing gases.

The magnetic film structure of the present invention is particularly well suited for use in a GMR head. The annealing process may therefore be duly limited to occur at a temperature that is not more than 350° C. GMR heads, by their nature, cannot survive annealing at temperatures well above this limit. The present invention produces magnetic anisotropy in the film structure despite this limit on the annealing temperature. Because the component materials of the present invention are deposited in crystalline form during formation of the film structure, higher temperatures are not required to form a crystalline structure or control its crystallographic texture. The crystalline form of the materials used for fabrication of the magnetic film therefore allow for the film to be used in GMR heads.

The T-M-X composition of the magnetic material does not have stringent composition limits. However, it is an object of the present invention to maintain the highest possible magnetic moment. In that respect, the best results are achieved when the magnetic component represented by T in the alloy formula T-M-X is at least 90 atomic % of the composition. Further, while there is a chance that crystalline materials may be successfully utilized as the nanolaminating materials, the preferred nanolaminating materials are amorphous. Accordingly, amorphous materials such as $Al_2O_3$, $SiO_2$, $ZrO_2$, yttria-stabilized $ZrO_2$, $TiO_2$, $HfO_2$, $Ta_2O_5$, $Si_3N_4$, AlN, $B_4C$, SiC, $Si_4N_4$ are suitable materials for the nanolaminations.

Figure 5:
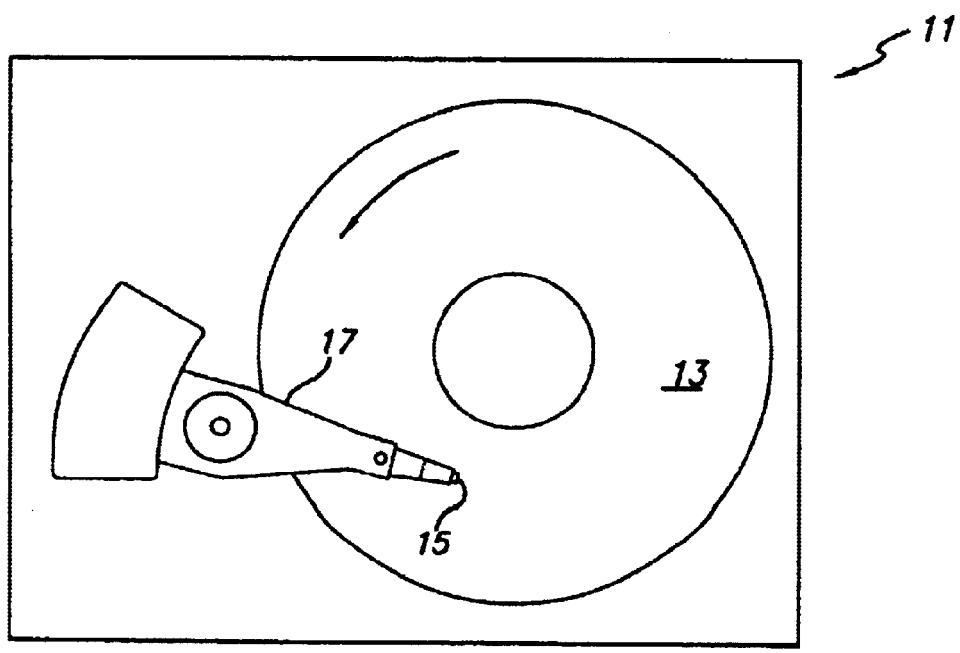
FIG. 5 illustrates a disk drive that utilizes the film structure of the present invention in its GMR head.
Figure 3B:
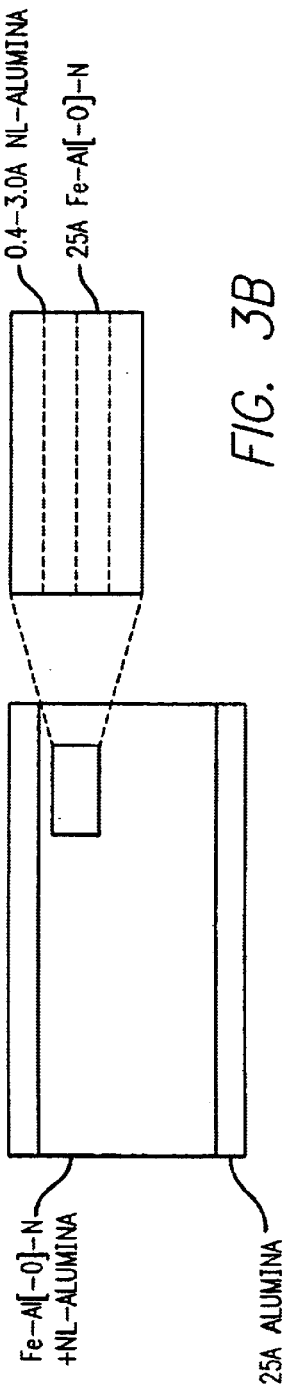
FIG. 3b is a cross-sectional view of a film structure according to a second embodiment of the present invention.

The foregoing description of the preferred embodiments of the invention has been presented for the purposes of illustration and description. It is not intended to be exhaustive or to limit the invention to the precise form disclosed. Many modifications and variations are possible in light of the above teaching. The invention may take the form of various embodiments. For example, in an alternative embodiment, laminated Fe—Al—N and Fe—Al—O—N films with the structure:

25Å alumina/x Å (Fe—Al—[O]—N+NL-alumina)/25Å alumina
   with x=1000–3000Å, as shown in FIG. 3b, may be deposited on a substrate in accordance with the present invention. Also, a variety of materials may be used for either the alumina layers or the layers containing sublayer nanolaminations of alumina. Variances in the thickness of the layers may occur within the film structure of the invention, including discontinuity of film layers. Further, the number of layers comprised in the film structure may be altered. Also, a different substrate material may be suitable for the film structure, and methods other than RF and DC magnetron sputtering may be employed to deposit the layers forming the film structure. Variances in specific film structure may be beneficial for different uses within a GMR head. The film structure, as embodied in a GMR head 15, may be implemented in a typical disk drive 11 further comprising a magnetic disk 13 and an actuator arm 17, as shown in FIG. 5. Examples of such modifications to the above description are as follows. An exemplary bilayer P1 film structure for use in a GMR head is:

1.5 μm $Ni_{80}Fe_{20}$/[25Å alumina/1000 Å (Fe—M—[O]—N+NL-alumina)]$_{2x}$

An exemplary P2 seed structure for use in a GMR head is:

25 Å alumina/1000 Å (Fe—M—[O]—N +NL-alumina)

An exemplary shield, pole, or yoke structure for use in a GMR head is:

[25 Å alumina/1000 Å (Fe—M—[O]—N +NL-alumina)]$_{20x}$/25 Å alumina=2.05 μm

Many further modifications to the teachings disclosed herein are possible. It is intended that the scope of the invention be limited not by this detailed description, but rather by the claims appended hereto.

What is claimed is:

1. A magnetic film comprising:
a magnetic alloy T-M-X wherein T is at least 90 atomic percent of Fe, M is selected from the group consisting of B, Al, Si, P, Ti, V, Cr, Cu, Ga, Ge, Zr, Nb, Mo, Ru, In, Sn, Hf, and Ta, and X is selected from the group consisting of N, and O—N; and
at least a single nanolamination of Al$_2$O$_3$, wherein said nanolamination is a discontinuous layer embedded within the magnetic alloy and has a thickness of 0.4–1.7 Å; and wherein said magnetic alloy has a total thickness of 1000–3000 Å.

2. A magnetic film according to claim 1, wherein T is Fe and X is N.

3. A method of forming a magnetic film according to claim 1 the method further comprising:
aligning a substrate with a first deposit target of Fe—Al;
depositing the magnetic alloy T-M-X from said first deposit target;
aligning the substrate with a second deposit target of Al$_2$O$_3$;
depositing the nanolamination from said second deposit target;
performing the depositions in an environment of a reactive gas selected from the group consisting of N$_2$ and N$_2$O; and
annealing the magnetic film at a temperature less than about 350° C.

4. A method according to claim 3 wherein power in the range of about 100–400 W is applied to the Al$_2$O$_3$ target.

5. A magnetic film structure comprising:
a plurality of repetitions of magnetic layers alternately laminated with relatively thinner nonmagnetic layers, wherein said magnetic layers comprise:
a magnetic alloy T-M-X wherein T is at least 90 atomic percent of Fe, M is selected from the group consisting of B, Al, Si, P, Ti, V, Cr, Cu, Ga, Ge, Zr, Nb, Mo, Ru, In, Sn, Hf, and Ta, and X is selected from the group consisting of N, and O—N; and
at least a single nanolamination of —Al$_2$O$_3$, wherein said nanolamination is a discontinuous layer; embedded within the magnetic alloy and has a thickness of 0.4–1.7 Å; wherein said magnetic alloy has a total thickness of 1000–3000 Å; and
said nonmagnetic layers are selected from the group consisting of Al$_2$O$_3$, SiO$_2$, ZrO$_2$, yttria-stabilized ZrO$_2$, TiO$_2$, HfO$_2$, Ta$_2$O$_5$, Si$_3$N$_4$, AlN, B$_4$C, SiC, Si$_4$N$_4$, Ta, Zr, and Hf.

6. A magnetic film structure according to claim 5 wherein T is Fe and X is N.

* * * * *